US008387961B2

(12) United States Patent
Im

(10) Patent No.: US 8,387,961 B2
(45) Date of Patent: Mar. 5, 2013

(54) VACUUM CHUCK

(76) Inventor: Kwon-Hyun Im, Seoul (KR)

(*) Notice: Subject to any disclaimer, the term of this patent is extended or adjusted under 35 U.S.C. 154(b) by 110 days.

(21) Appl. No.: 12/863,545

(22) PCT Filed: Jan. 19, 2009

(86) PCT No.: PCT/KR2009/000273
§ 371 (c)(1),
(2), (4) Date: Aug. 12, 2010

(87) PCT Pub. No.: WO2009/091226
PCT Pub. Date: Jul. 23, 2009

(65) Prior Publication Data
US 2010/0301534 A1 Dec. 2, 2010

(30) Foreign Application Priority Data
Jan. 18, 2008 (KR) .................. 10-2008-0005742

(51) Int. Cl.
B25B 11/00 (2006.01)
(52) U.S. Cl. .................. 269/21; 269/309; 269/310
(58) Field of Classification Search .......... 269/20, 269/309, 310, 21; 279/3; 451/388
See application file for complete search history.

(56) References Cited

U.S. PATENT DOCUMENTS

| | | | | |
|---|---|---|---|---|
| 3,233,887 A | * | 2/1966 | Dunham | 269/21 |
| 3,511,273 A | * | 5/1970 | Bartholomaus | 137/557 |
| 3,711,082 A | * | 1/1973 | Seidenfaden | 269/21 |
| 3,999,795 A | * | 12/1976 | Barker | 294/185 |
| 4,066,249 A | * | 1/1978 | Huber et al. | 269/21 |
| 4,139,051 A | * | 2/1979 | Jones et al. | 165/80.1 |
| 4,190,240 A | * | 2/1980 | Peterson | 269/21 |
| 4,610,440 A | * | 9/1986 | Casset | 269/20 |
| 5,775,395 A | | 7/1998 | Wilkins | |

(Continued)

FOREIGN PATENT DOCUMENTS

| JP | 63-062347 A | 3/1988 |
|---|---|---|
| JP | 2000-308934 A | 11/2000 |

(Continued)

OTHER PUBLICATIONS

Initial Search Report mailed Sep. 17, 2009 for the corresponding International Application No. PCT/KR2009/000273.

Primary Examiner — Joseph J Hail
Assistant Examiner — Joel Crandall
(74) Attorney, Agent, or Firm — Leason Ellis LLP.

(57) ABSTRACT

A vacuum chuck comprises a main body including a support projection and a vacuum groove arranged in a lattice form on the top surface thereof, an installation space, a vacuum space, a filter space. The main body further includes an inlet that communicates with the installation space and an outlet that communicates with the vacuum space. An air saving valve B, a vacuum sensor S, a vacuum generator V and a filter F are installed in the installation space, vacuum space and filter space of the main body. A pressure gauge and a vacuum gauge that are mounted on the front side and communicate with the inlet and the vacuum space respectively. A main body cover that is air-tightly coupled to the lower part of the main body, and a filter cover that is air-tightly coupled to the lower part of the filter space.

9 Claims, 16 Drawing Sheets

U.S. PATENT DOCUMENTS

| | | | | |
|---|---|---|---|---|
| 6,419,455 B1* | 7/2002 | Rousseau et al. | ............ | 417/44.2 |
| 6,572,091 B2* | 6/2003 | Kimble | ........................... | 269/21 |
| 7,637,548 B2* | 12/2009 | Fukano et al. | ................ | 294/186 |
| 7,686,590 B2* | 3/2010 | Ishii et al. | ..................... | 417/44.2 |
| 7,716,818 B2* | 5/2010 | Tsuji et al. | ...................... | 29/740 |
| 2008/0169593 A1* | 7/2008 | Shen et al. | ...................... | 269/21 |
| 2010/0283194 A1* | 11/2010 | Han | ................................ | 269/21 |
| 2010/0301534 A1* | 12/2010 | Im | .................................. | 269/21 |

FOREIGN PATENT DOCUMENTS

JP     2001-287129 A     10/2001

* cited by examiner

VACUUM CHUCK

TECHNICAL FIELD

The invention relates to a vacuum chuck clamping artifacts to be processed that are not fixed with vice or magnetic chuck by adsorbing them with air pressure only and more particularly to a vacuum chuck capable of reducing cost and weight by making its structure simple and shortening the clamping time.

BACKGROUND ART

Generally, a vacuum chuck fixes artifacts to be processed that are not fixed with vice or magnetic chuck and the vacuum chuck fixes artifacts to be processed such as acrylic, plastic, stainless steel, aluminum as well as metal material with air pressure only regardless of material.

However, the vacuum chuck in the art has a problem in that its structure is so complex that the cost increases and the weight is high and appearance is not elegant in its structure.

Further, the vacuum chuck in the art has a difficulty to substitute parts when repairing it in its structure.

Further, it is not possible to identify the pressure state of the vacuum chuck from outside, assembling and vacuum efficiency are low in the structure since the vacuum gauge is assembled using hose and nipple and a gauge cover to protect the vacuum gauge is to be separately installed.

DISCLOSURE

Technical Problem

It is an object of the invention to provide a vacuum chuck capable of reducing cost and weight by making the structure of vacuum chuck, providing an elegant appearance, substituting parts with ease when repairing it and reducing clamping time for the artifacts to be processed.

It is another object of the invention to provide a vacuum chuck capable of identifying the pressure state of the vacuum chuck from outside with ease by installing a pressure gauge, enhancing assembling and vacuum efficiency by directly assembling the vacuum gauge without using hose and nipple and integrating a gauge cover without installing it separately, thereby reducing the cost.

Technical Solution

In an aspect of the invention, there is provided a vacuum chuck that includes a main body that has a support projection and a vacuum groove arranged in a lattice form on the top surface, an installation space thereof. The chuck further includes a vacuum space and a filter space below the top surface and within the main body to form a vacuum hole communicating with the vacuum groove of the filter space. An inlet communicates with the installation space and, while an outlet communicates with the vacuum space on the rear side of the main body. An air saving valve, a vacuum sensor, a vacuum generator and a filter are installed in the installation space, vacuum space and filter space of the main body respectively. A pressure gauge and a vacuum gauge are mounted on the front side of the main body, where the pressure gage communicates with the inlet and the vacuum gage communicates with the vacuum space. A switch is installed in the front-middle of the main body to move to and fro so as to open and close the vacuum space. A main body cover is air-tightly coupled to the lower part of the main body. A filter cover is coupled to the lower part of the filter space.

Advantageous Effects

A vacuum chuck of the invention has effects in that its cost and weight can be reduced since it has a simple structure, it has an elegant appearance, its parts can be substituted with ease when repairing it and clamping time of the artifacts to be processed can be shortened.

Further, a vacuum chuck of the invention has effects in that it is possible to identify pressure state of the vacuum chuck with ease from outside using a pressure gauge, assembling and vacuum efficiency can be enhanced by using a vacuum gauge directly without using hose and nipple and cost can be reduced by integrating a gauge cover without installing it separately.

BEST MODE

Figure 1:
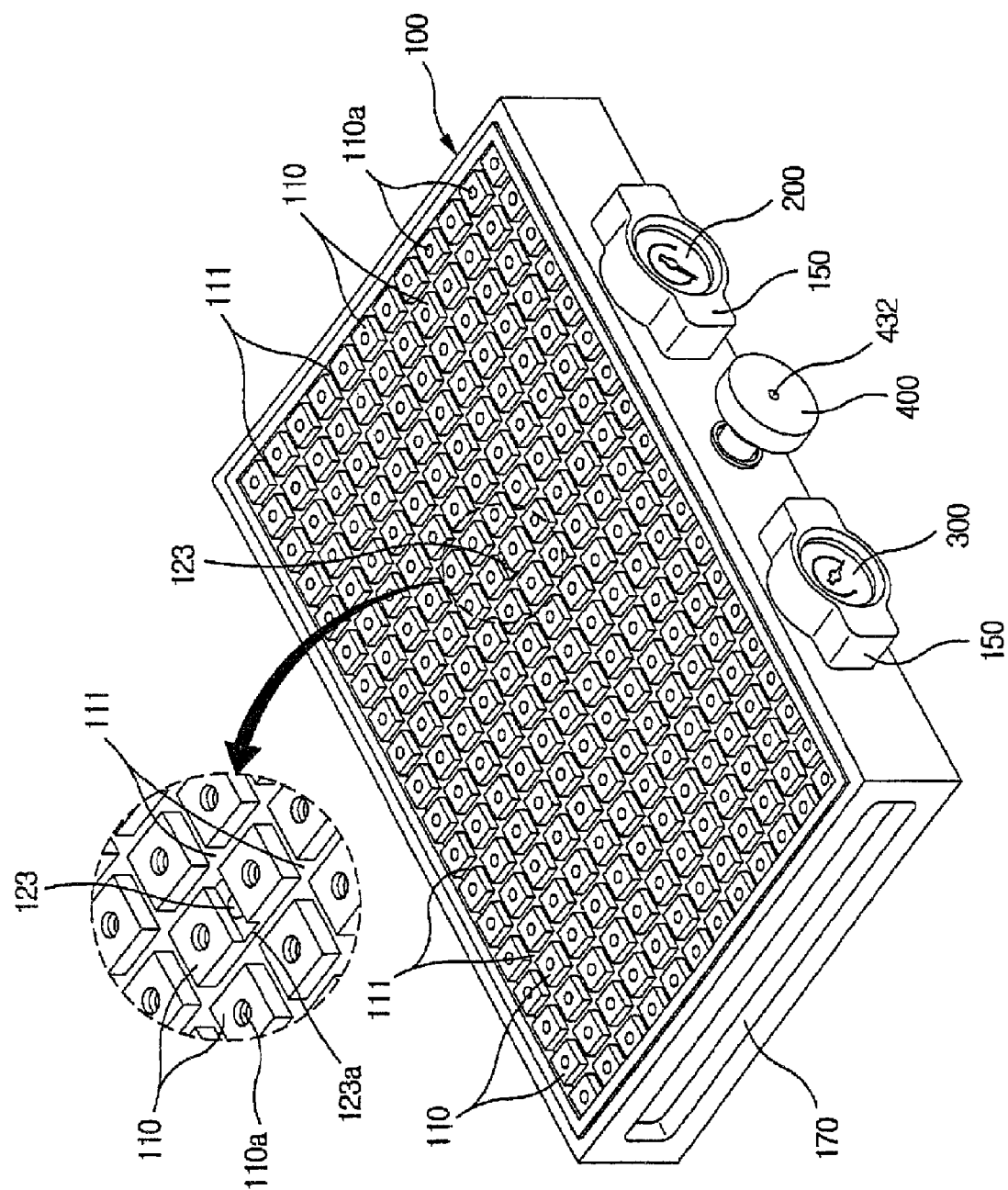
FIG. 1 is a perspective view of the invention.
Figure 2:
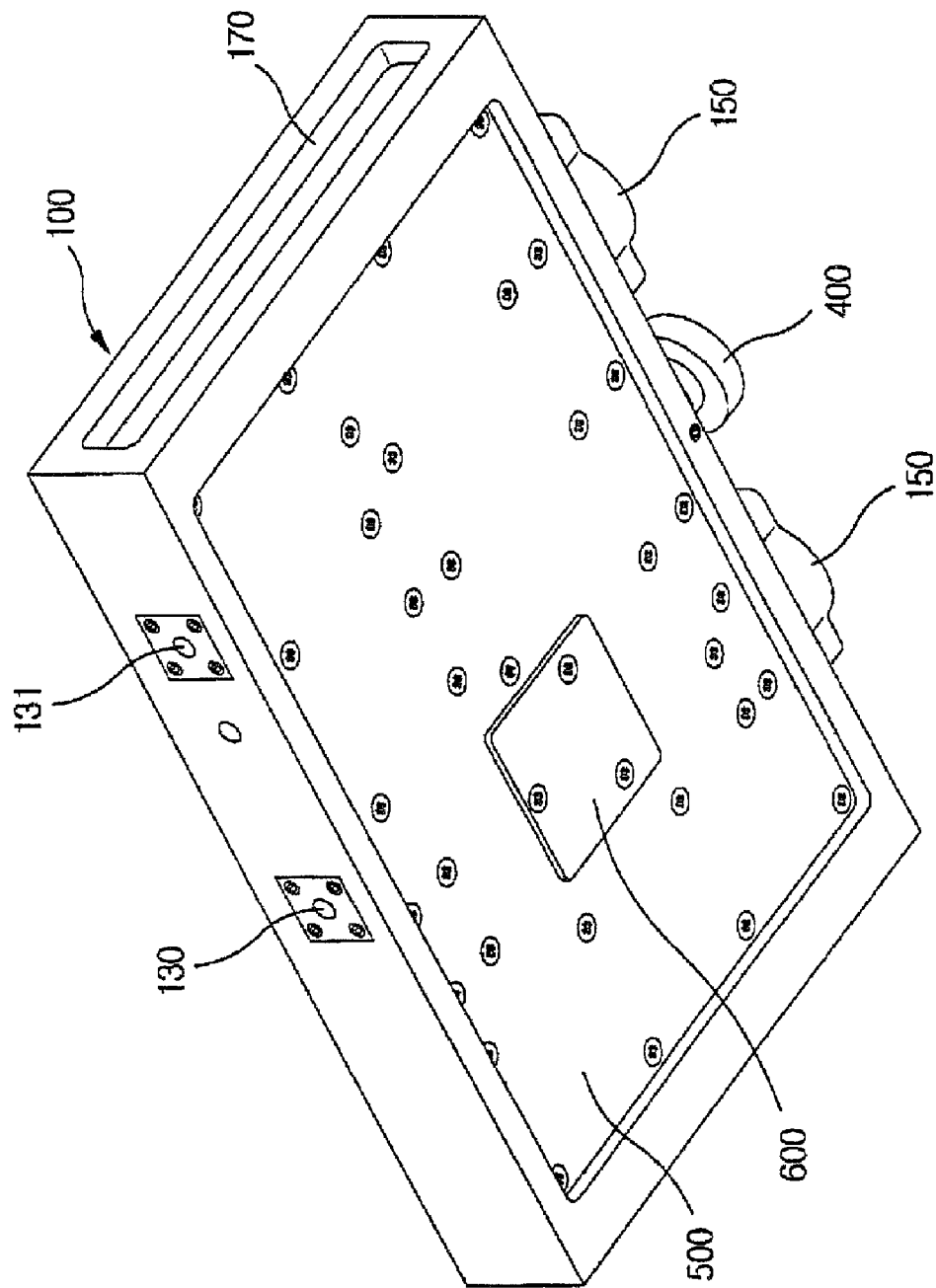
FIG. 2 is a perspective view showing a rear surface of the invention.

Hereinafter, reference will now be made in detail to various embodiments of vacuum chuck disclosed herein, examples of which are illustrated in the accompanying drawings and described below.

As shown in FIGS. 1 to 17, the vacuum chuck of the invention includes a main body 100 including a support projection 110 and a vacuum groove 111 arranged in a lattice form on the top surface thereof. An installation space 120, a vacuum space 121 and a filter space 122 are located below the top surface and within the main body, and have a vacuum hole 123 communicating with the vacuum groove 111 of the filter space 122. The inlet 130 communicates with the installation space 120, while the outlet 131 communicates with and the vacuum space 121 on the rear side of the main body. An air saving valve B, a vacuum sensor S, a vacuum generator V and a filter F are installed in the installation space 120, vacuum space 121 and filter space 122 of the main body 100 respectively. A pressure gauge 200 and a vacuum gauge 300 are mounted on the front side of the main body 100, where the pressure gage 200 communicates with the inlet 130 and the vacuum gage communicates with the vacuum space 121. A switch 400 is installed in the front-middle of the main body 100 to move to and fro so as to open and close the vacuum space 121. A main body cover 500 that is air-tightly coupled to the lower part of the main body 100. A filter cover 600 is air-tightly coupled to the lower part of the filter space 122.

Here, a plurality of support projections 110 and a plurality of vacuum grooves 111 are arranged in a lattice form as shown in FIG. 1. At this time, an O-ring is inserted into the vacuum groove 111 with reference to the vacuum hole 123 in order to suitably control a clamping scope according to form and size of the artifacts to be processed, and the O-ring is tightly attached to the artifacts to be processed that are safely received in the main body 100.

Figure 16:
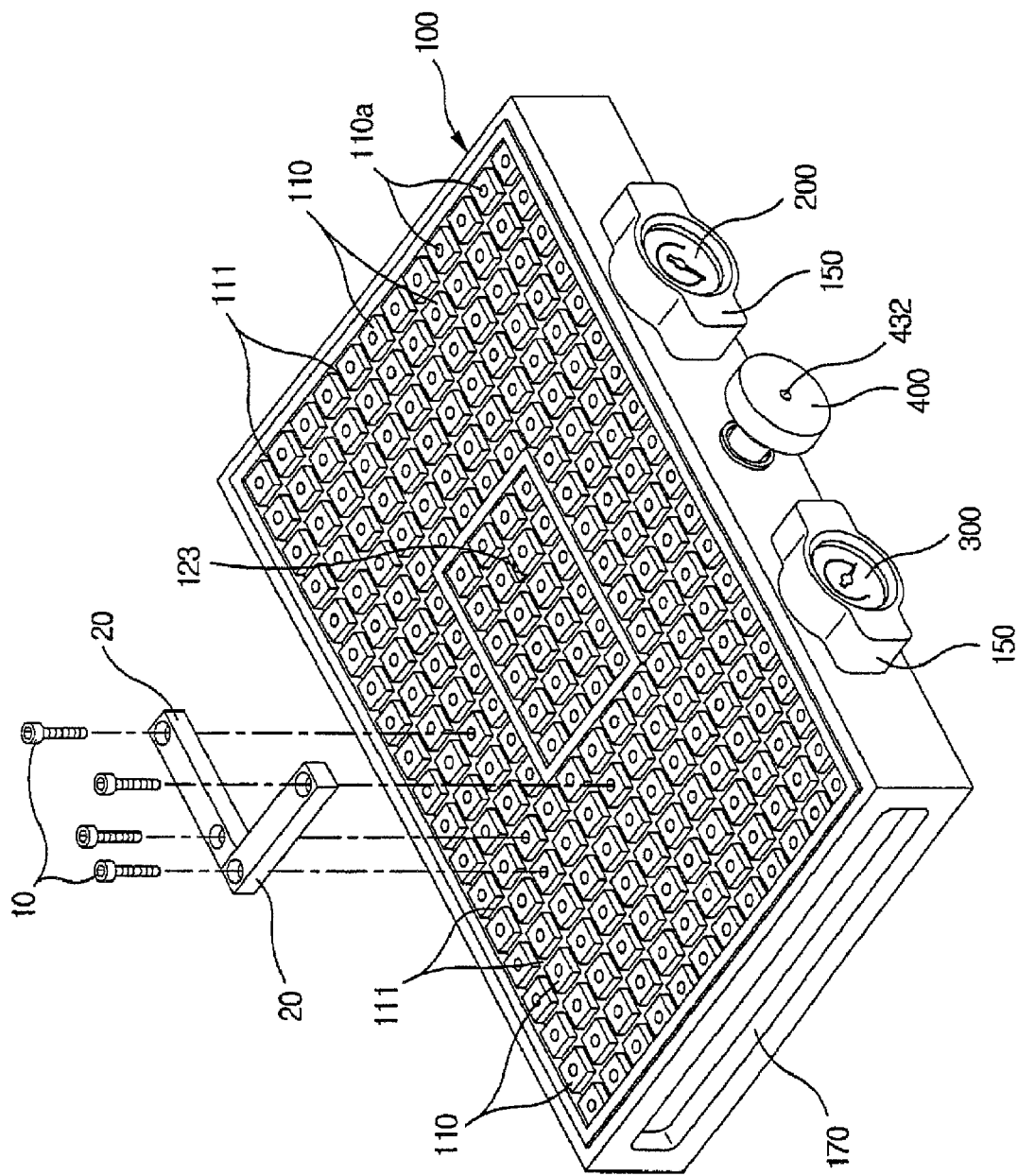
FIGS. 16 and 17 are exemplary views showing a clamping reference point setting according to an embodiment of the invention.
Figure 17:
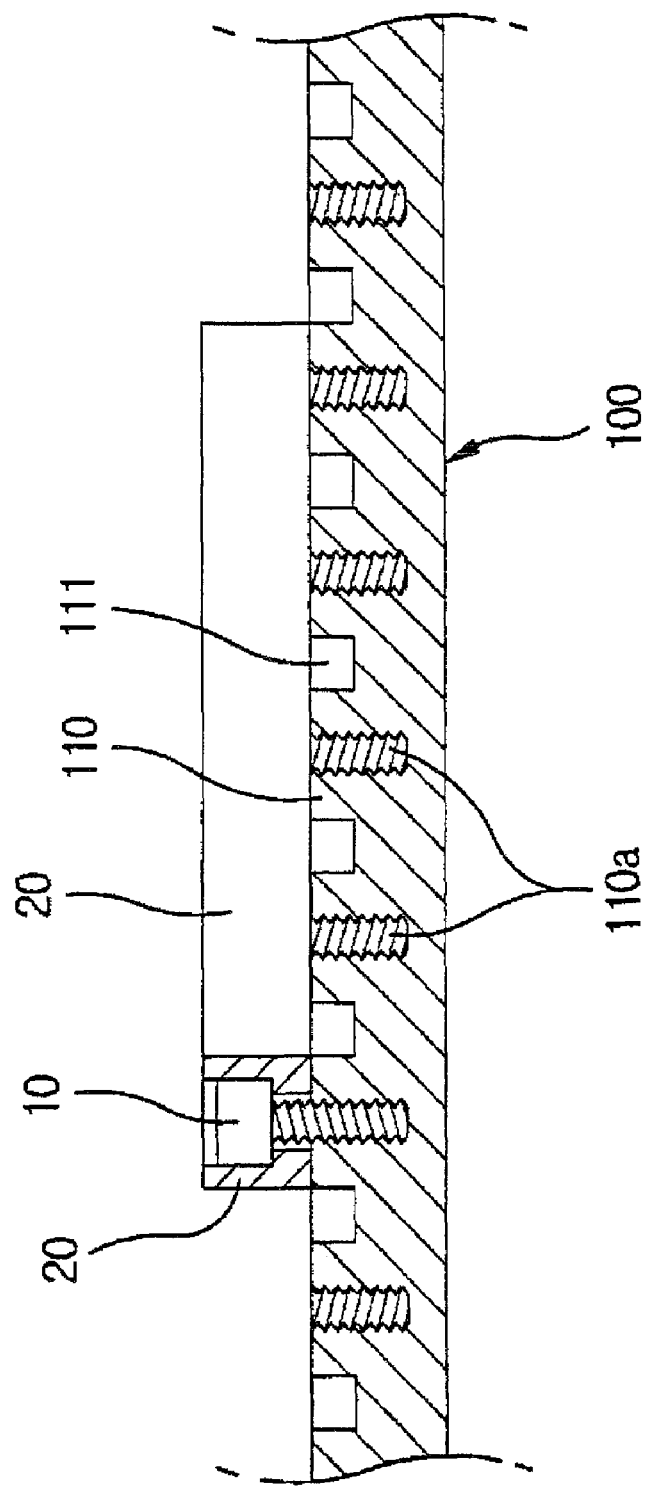

According to an embodiment of the invention, a female screw 110a is provided for setting a reference point in a plurality of support projections 110 as shown in FIGS. 16 and 17. Therefore, according to the embodiment of the invention, it is possible to set the clamping reference point according to the form and size of the artifacts to be processed when fixing a reference plate 20 to the female screw 110a of the support projection 110 in a coupling of the screw 10 as shown in FIGS. 16 and 17.

Figure 4:
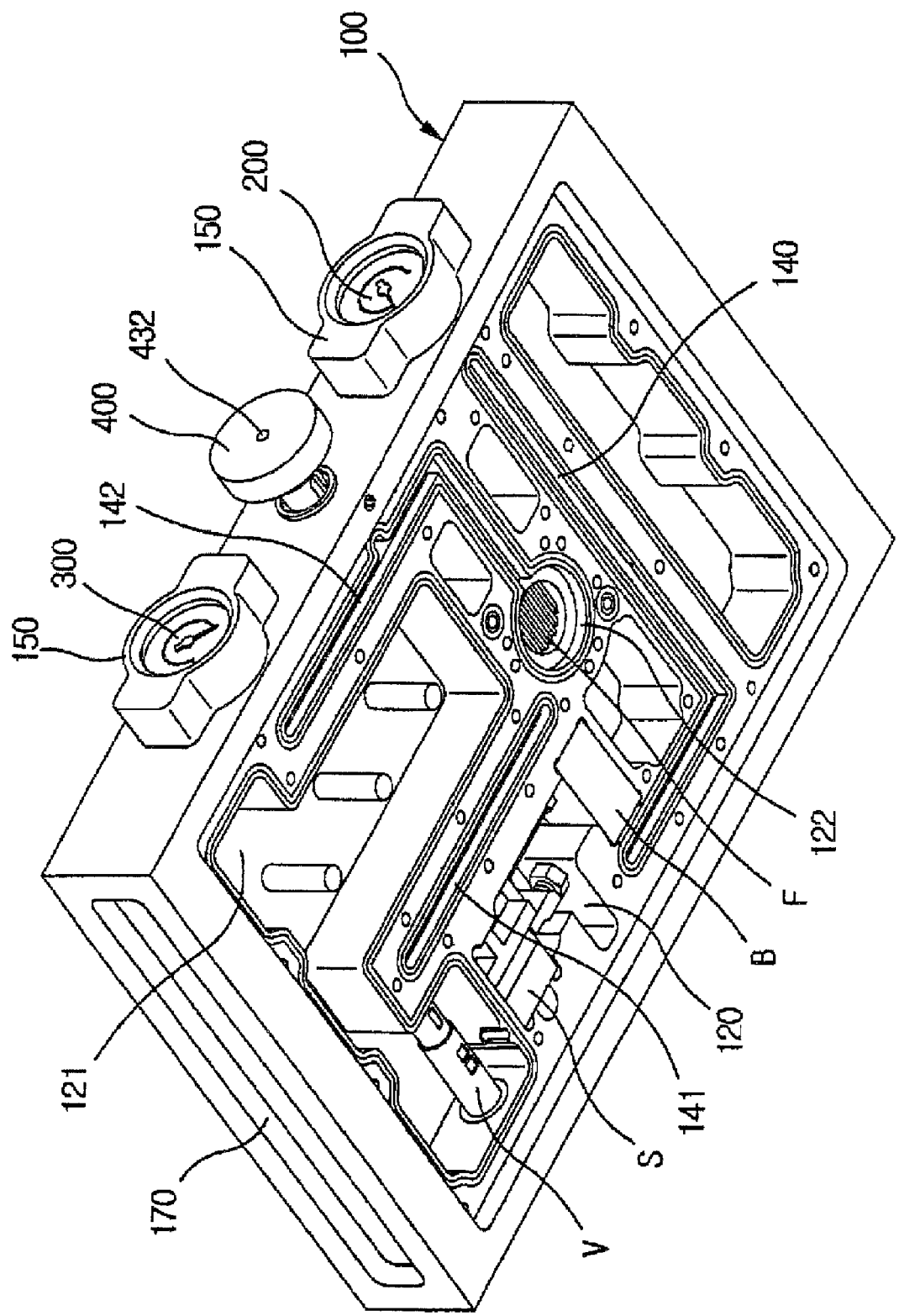
FIGS. 4 and 5 are schematic views showing bottom surface of a main body according to the invention.
Figure 5:
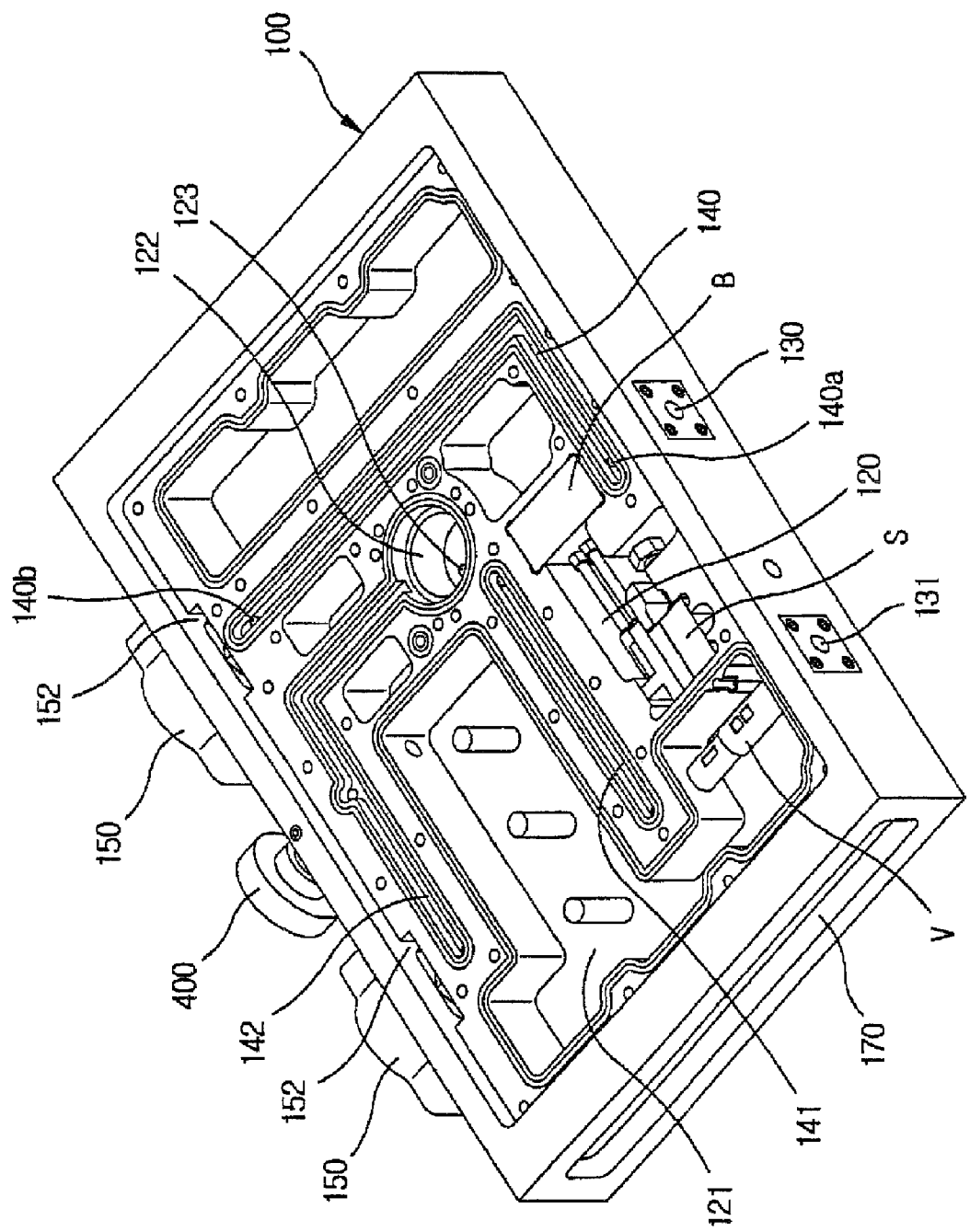
Figure 6:
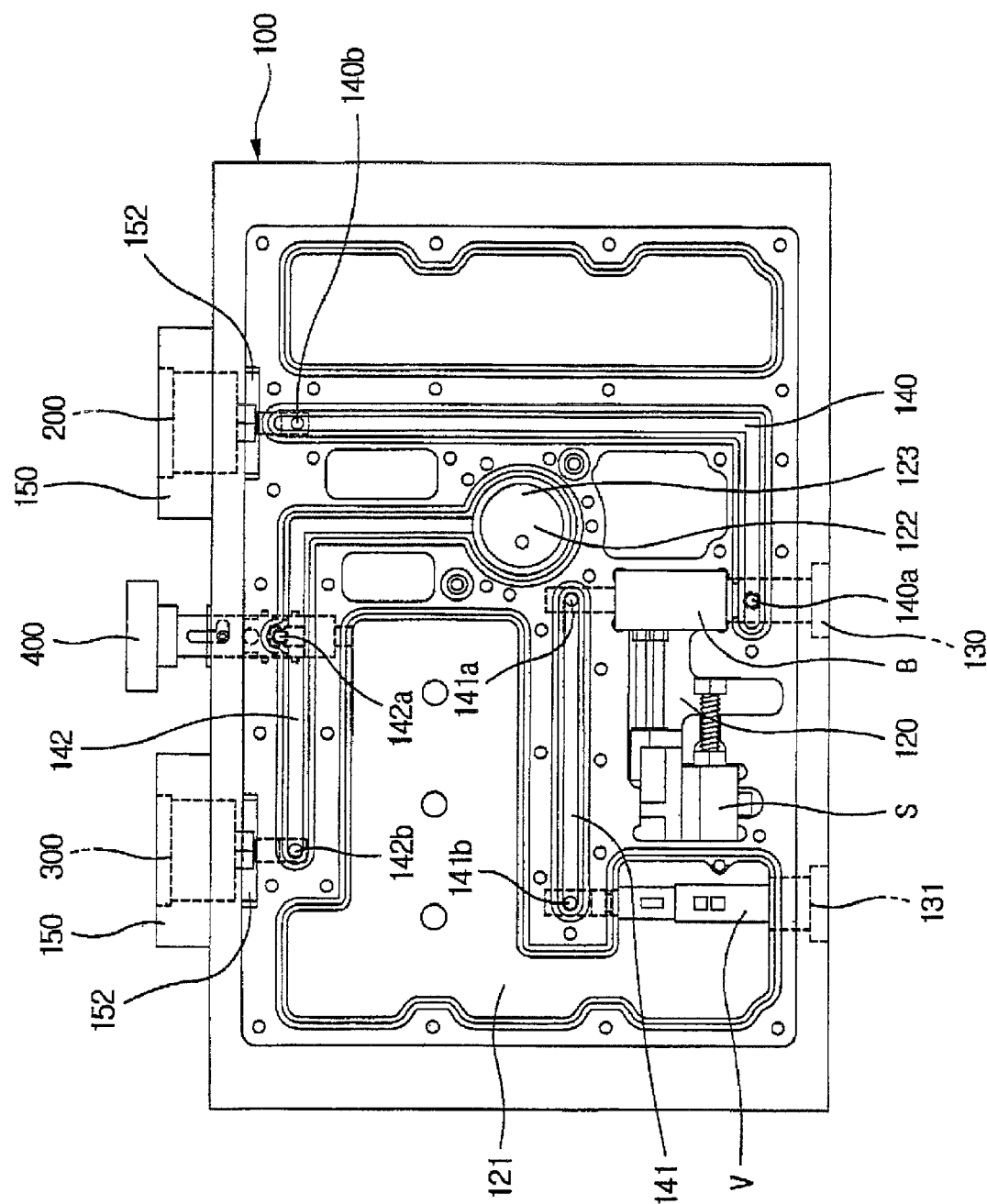
FIG. 6 is a bottom view according to the invention.

The installation space 120, the vacuum space 121 and the filter space 122 are formed in the main body 100, respectively and a vacuum hole 123 communicating with the vacuum groove 111 is formed on the filter space 122, as shown in FIGS. 4, 5 and 6. At this time, the air saving valve B and the vacuum sensor S are installed in the installation space 120, a vacuum generator V is installed in the vacuum space 121 and a filter is installed in the filter space 122.

Figure 7:
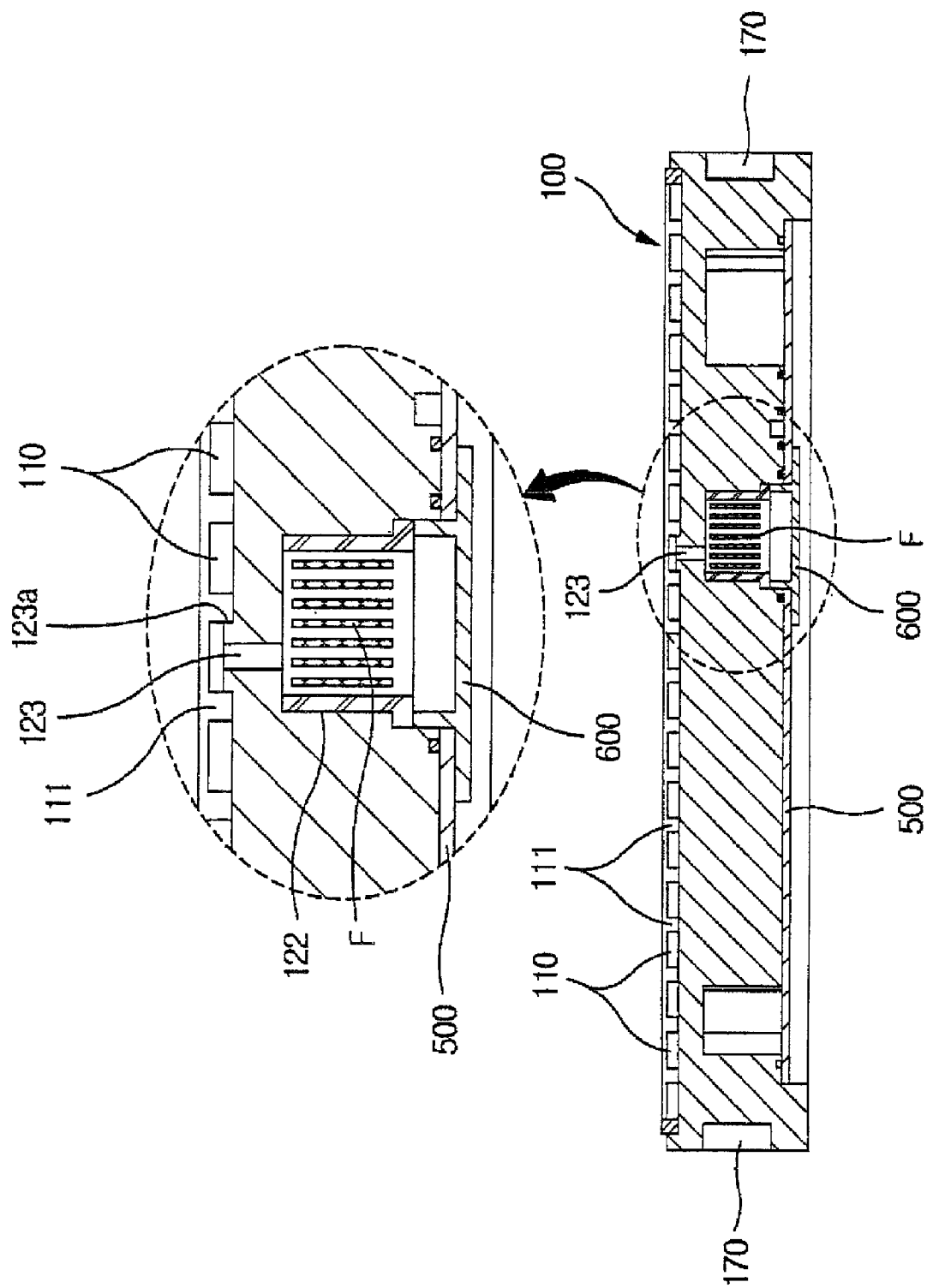
FIG. 7 is a sectional view of the invention.
Figure 8:
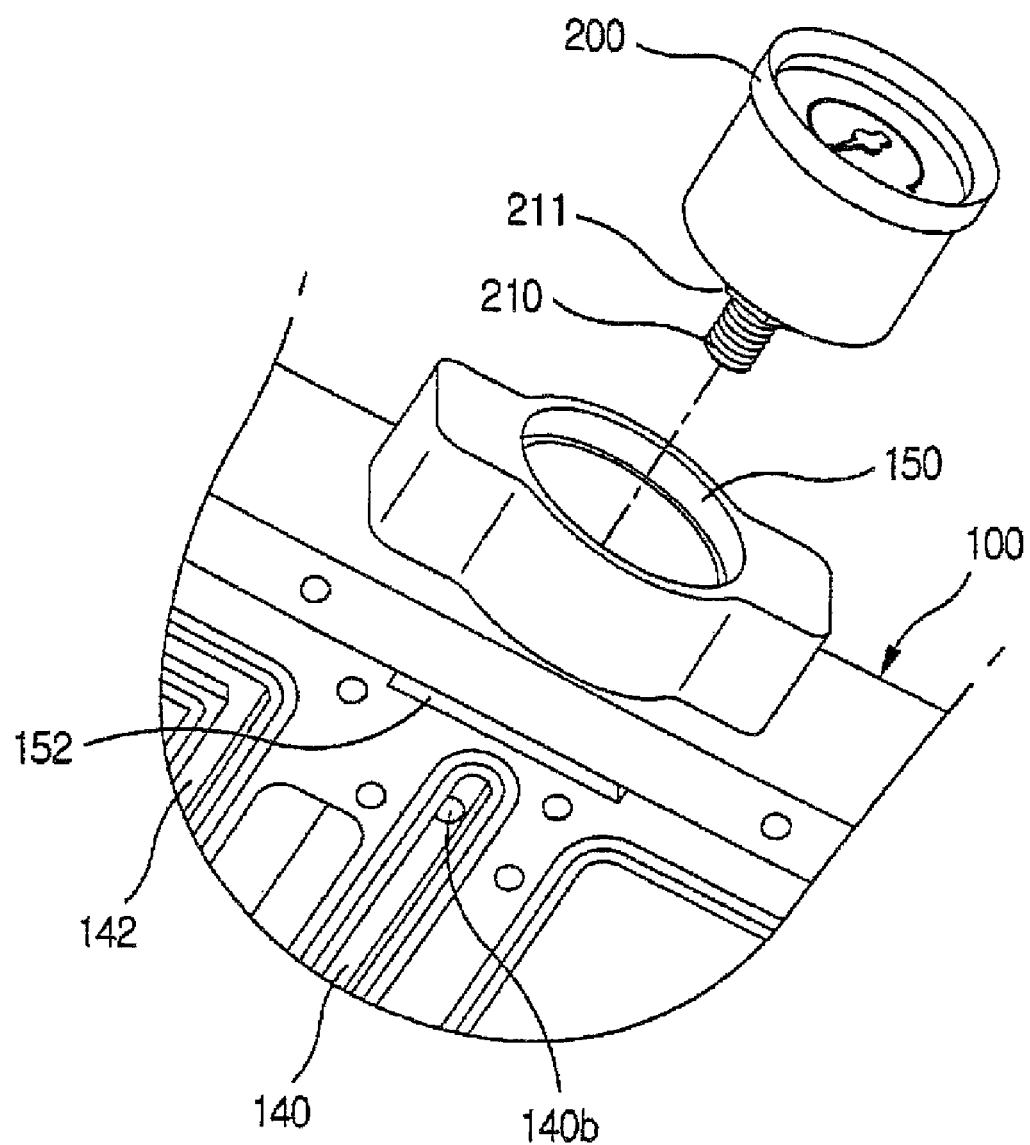
FIG. 8 is an exploded schematic view of a pressure gauge according to the invention.

According to an embodiment of the invention, as shown in FIGS. 1 and 7, a threshold 123a is formed in the upper-outside of the vacuum hole 123, which prevents foreign substances from inflowing. Therefore, according to an embodiment of the invention, foreign substances such as cutting oil or cutting chip are prevented from being flown into the vacuum hole 123 by the threshold 123a.

An inlet 130 and an outlet 131 communicating with the installation space 120 and the vacuum space 121 respectively are formed on the rear side of the main body 100, as shown in FIGS. 5 and 6. At this time, a compressor providing compressed air is connected to the outside of the inlet 130. An air inflow unit of the air saving valve B is connected to the inside of the inlet 130 and an air discharge unit of the vacuum generator V is connected to the outlet 131.

A first pressure line 140 communicating with the inlet 130 and the pressure gauge 200 is formed inside the main body 100. At this time, the first pressure line 140 is formed in an "L" shape, which includes through holes 140a and 140b communicating with the inlet 130 and pressure gauge 200, respectively. An O-ring mounted in the left side of the first pressure line 140. Accordingly, when compressed air is provided to the inlet 130, some of the compressed air is transferred to the air inflow unit of the air saving valve B, some of the compressed air flows into the first pressure line 140 through the through hole 140a and the compressed air flowing into the first pressure line 140 is transferred to the pressure gauge 200 through the through hole 140b.

The second pressure line 141 communicating with the air saving valve B and the vacuum generator V is formed in the main body 100. At this time, the second pressure line 141 is formed in the "-" shape and includes through holes 142a and 142b communicating with the vacuum space 121 and the vacuum gauge 300, respectively, and an O-ring is mounted in the outside of the vacuum line 142. Accordingly, the compressed air transferred to the air saving valve B is flown into the second pressure line 141 through the through hole 141a, the compressed air flown into the second pressure line 141 is transferred to the vacuum generator V through the through hole 141b, vacuum is generated by the vacuum generator V when the compressed air is flown into the vacuum generator V, the vacuum generated by the vacuum generator V is stored in the vacuum space 121 and the air that has passed through the vacuum generator V escapes outside through the outlet 131.

The vacuum line 142 is formed in the main body 100, which communicates with the vacuum space 121, the filter space 122 and the vacuum gauge 300. At this time, the vacuum line 142 is formed in the form "∟", and includes through holes 142a and 142b that communicate with the vacuum space 121 and the vacuum gauge 300, respectively, and has O-ring mounted in the outside of the vacuum line 142.

Two gauge covers 150 receiving the pressure gauge 200 and the vacuum gauge 300, respectively are formed integrally with both front sides of the main body 100. At this time, female screws 151 screw-coupled to bolts 210 and 310 of the pressure gauge and vacuum gauges 200 and 300 are included in the inner-middle part of the gauge cover 150 as shown in FIGS. 8 and 9 and FIGS. 10 and 11 and wrench grooves 152 used to turn nuts 211 and 311 of the pressure gauge and the vacuum gauge 200 and 300 are formed in the front-lower of the female screw 151, respectively. Accordingly, the assembling is simply performed with using hose and nipple when inserting the pressure gauge 200 and the vacuum gauge 300 into the gauge cover 150, respectively, coupling the bolts 210 and 310 included in the rear part of the pressure gauge and the vacuum gauge 200 and 300 into the female screws 151 directly and finally turning the nuts 211 and 311 of the pressure gauge and the vacuum gauge 200 and 300 through the wrench groove 152 using the wrench.

Figure 12:
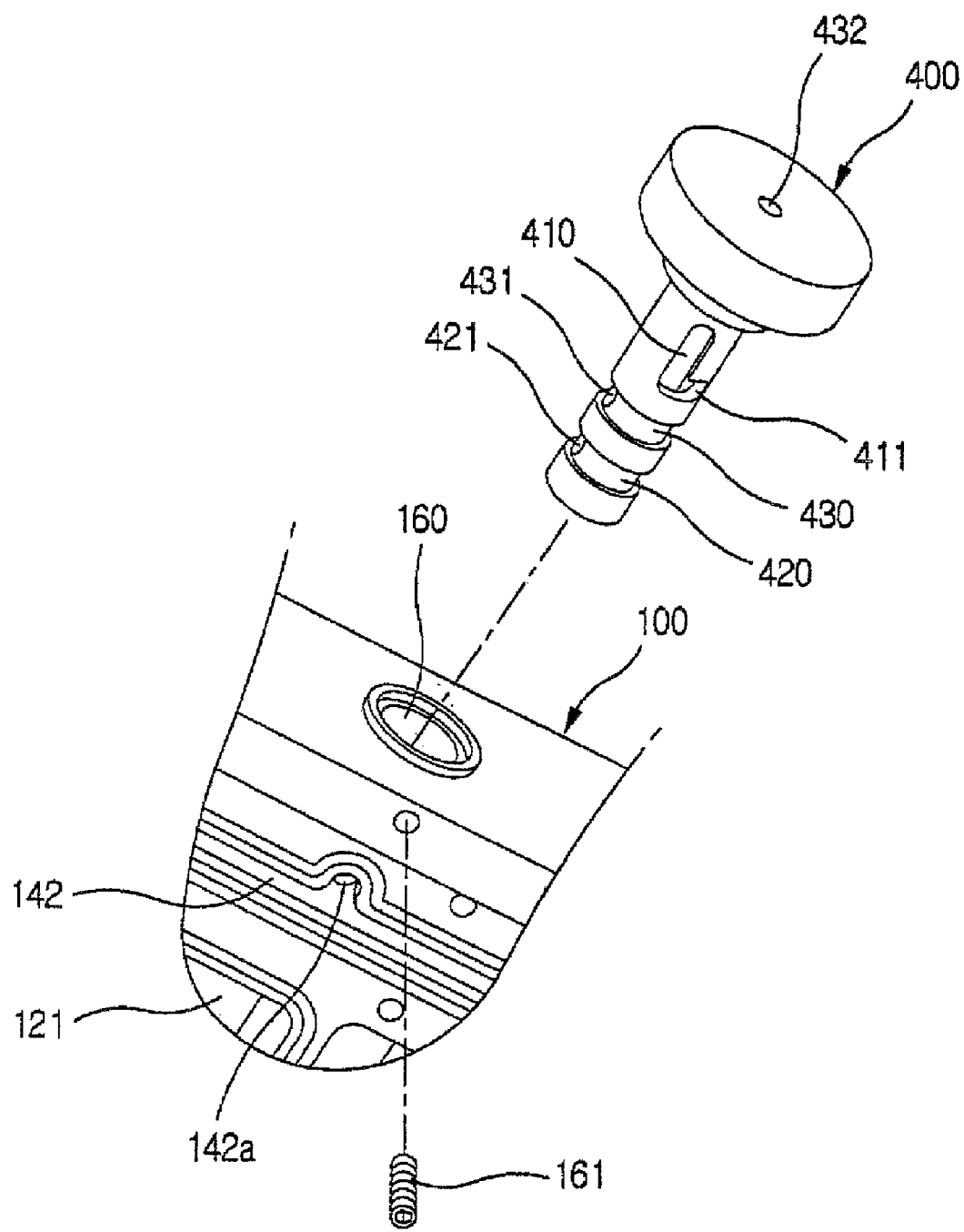
FIG. 12 is an exploded schematic view of a switch according to the invention.
Figure 13:
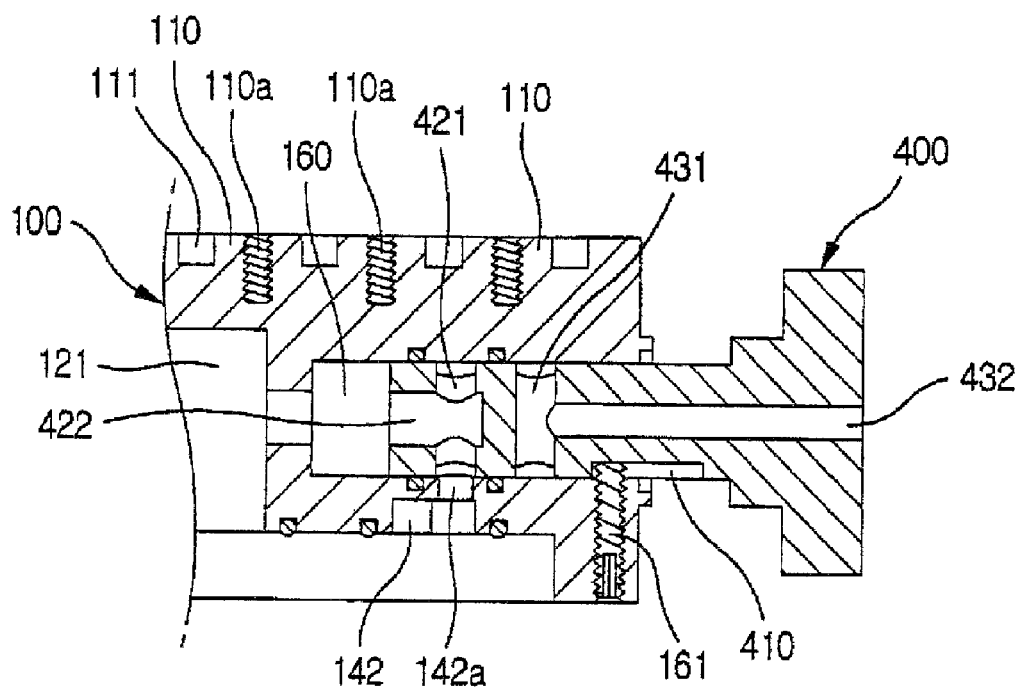
FIGS. 13 and 14 show sectional views showing an assembling state and an operational state of FIG. 12.
Figure 14:
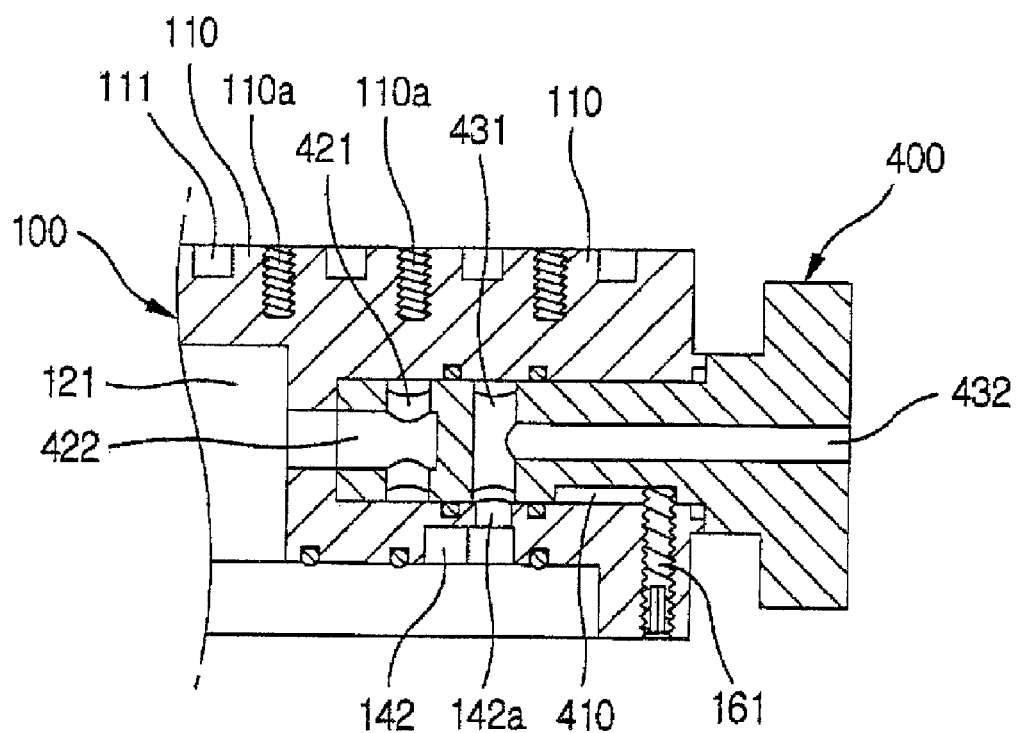

The switch groove 160 receiving the switch 400 is formed in the front-middle of the main body 100. At this time, the switch groove 160 is formed to pass through the vacuum space 121 as shown in FIGS. 12, 13 and 14 and includes the key 161 to guide and control the operation of the switch 400.

Clamp groove-handle 170 is formed on both sides of the main body 100. Since the air saving valve B is installed in the installation space 120 of the main body 100, such air saving valve B automatically shuts off inflow of the compressed air when it is needed to generate vacuum according to a suitable vacuum pressure.

The vacuum sensor S is installed in the installation space 120 of the main body 100, which senses the vacuum pressure of the vacuum space 121 and transfers it to the air saving valve B.

The vacuum generator V is installed in the vacuum space 121 of the main body 100, vacuum is generated when compressed air is flown into the vacuum generator V and the vacuum generated in the vacuum generator V is stored in the vacuum space 121.

The filter F is installed in the filter space 122 of the main body 100 and such a filter filters out foreign substances.

The pressure gauge 200 is installed in the gauge cover 150 formed integrally with the main body 100 and pressure state of the vacuum chuck can be identified with ease from the outside through such a pressure gauge 200.

The vacuum gauge 300 is installed on the gauge cover 150 that is integrally formed therewith and it is possible to identify the vacuum state of both vacuum spaces 121 from the outside through the vacuum gauge 300.

The switch 400 is installed in the switch groove 160 formed in the front-middle of the main body 100 to be movable to and fro, respectively, so as to open and close the vacuum space 121. A key groove 410 and a control groove 411 inserted into the key 161 are formed in one outer surface of the such a switch 400 as shown in FIGS. 12, 13 and 14, first and second ring-shaped grooves 420 and 430 are formed in the rear-outer surface of the switch 400, first and second through holes 421 and 431 communicating with the vacuum line 142 are formed in the first and second ring-shaped grooves 420 and 430, the first connection hole 422 communicating with the vacuum space 121 passes through in the rear direction in the middle of the first through hole 421 and the second connection hole 432 communicating with the outside passes through in the front direction in the middle of the second through hole 431.

Figure 9:
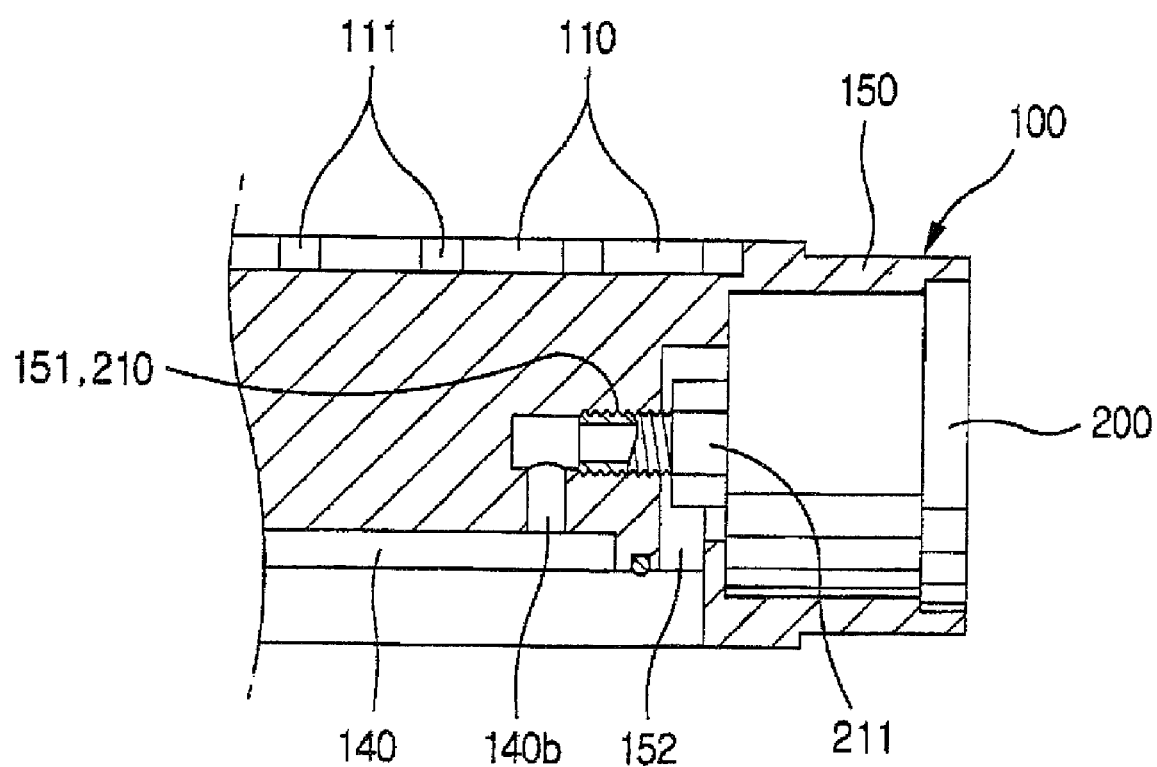
FIG. 9 is an assembling sectional view of FIG. 8.
Figure 10:
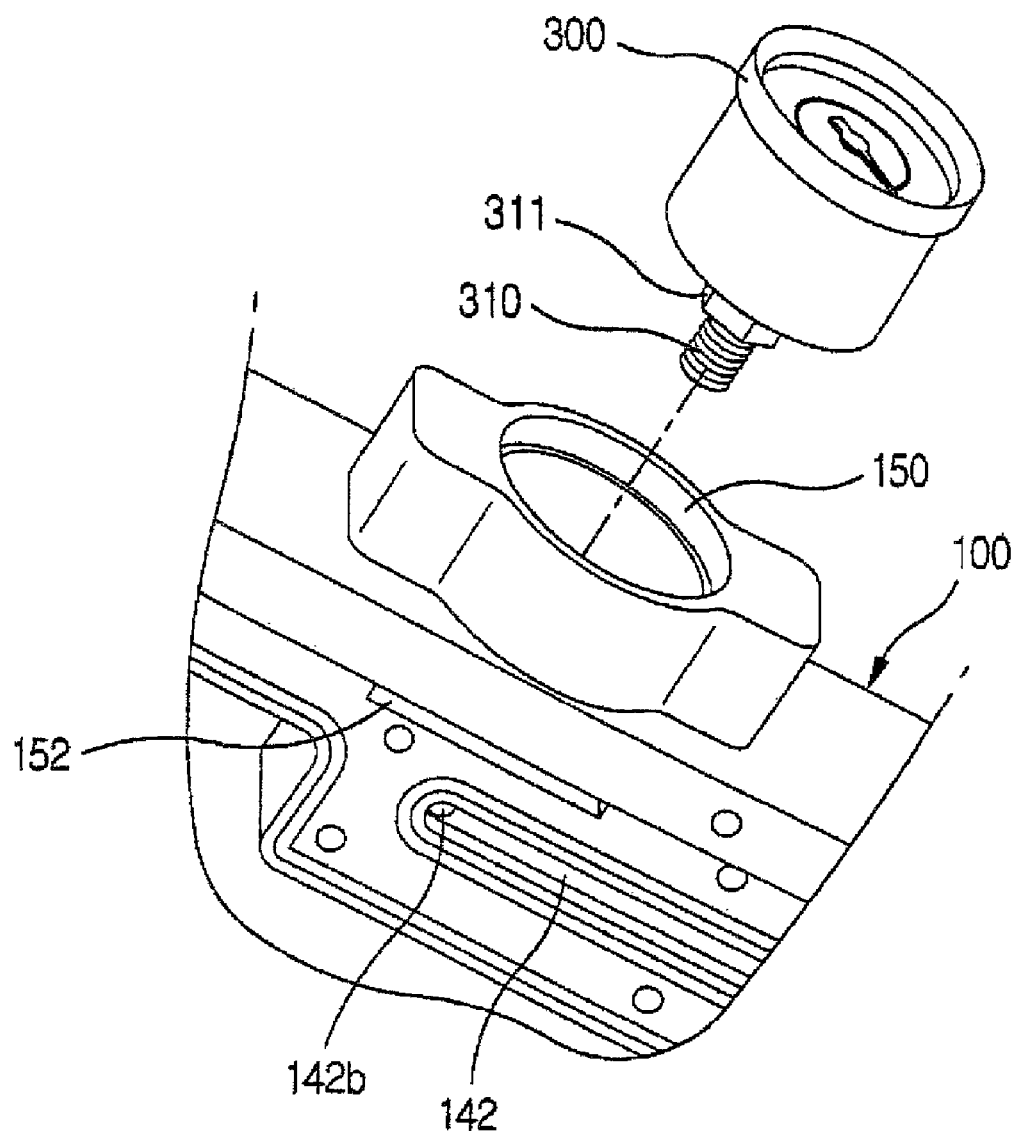
FIG. 10 is an exploded schematic view of a vacuum gauge according to the invention.
Figure 11:
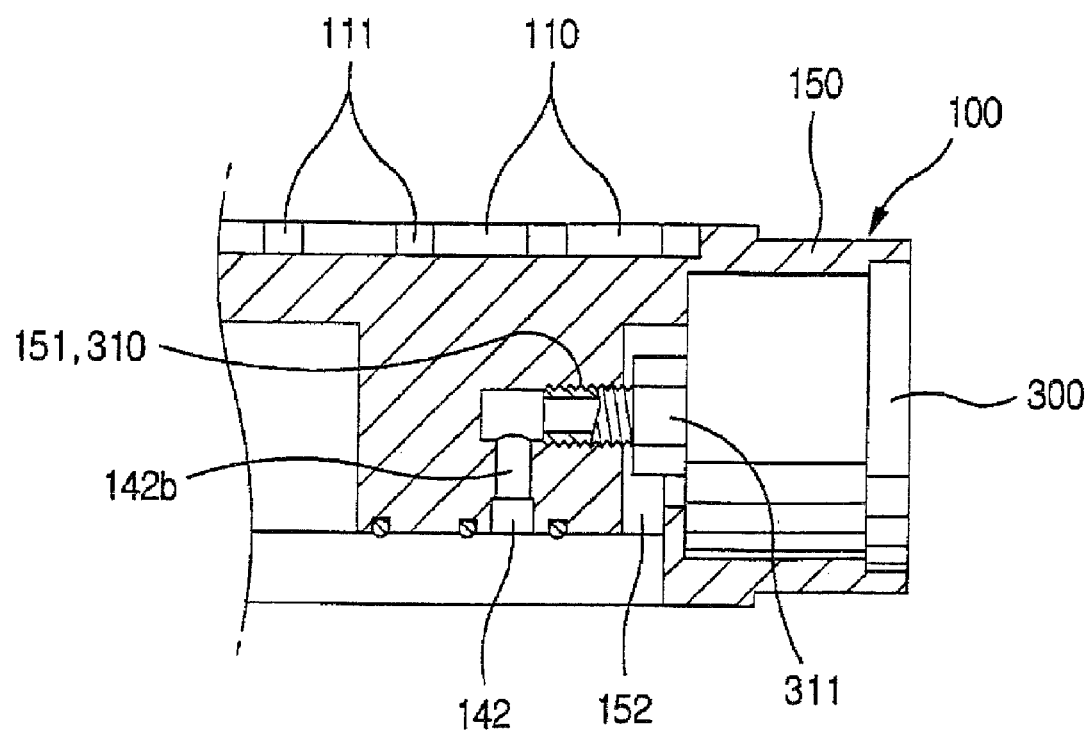
FIG. 11 is an assembling sectional view of FIG. 10.

When the switch 400 is pushed into the inner part shown in FIG. 9, the vacuum space is closed by the switch 400 and accordingly the vacuum space 121 and the vacuum line 142 maintain the state in which there is no flow through them. Further, since the second through hole 431 of the switch 400 and the through hole 142a of the vacuum communicate with each other in this state, as shown in the drawing, and outside air flows into the vacuum line 142 through the second connection hole 432 connected to the second through hole 431, as a result, the vacuum line 142 maintains a state in which the vacuum is released.

Accordingly, since the vacuum of the vacuum line 142 is released when the switch 400 is pushed inside, vacuum adsorption force is not generated on the vacuum hole 123 and vacuum gauge 300 of the main body 100.

Since the switch 400 is inversely pushed outside as shown in FIG. 13, since the vacuum space 121 is opened while the first through hole 421 of the switch 400 and the through hole 142a of the vacuum line 142 communicate each other and the vacuum space 121 and the vacuum line 142 pass through each other through the first connection hole 422 connected to the first through hole 421, the vacuum line resultantly maintains the vacuum state. Further, since the second through hole 431 of the switch 400 is closed in this state, outside air is not flown into the vacuum line 142. Meanwhile, when turning the switch 400 in the state that the switch 400 is pulled to the outside, since the key 161 is inserted into the control groove 411, the switch 400 is not entered to the inside even though the switch 400 is pushed to the inside. Accordingly, since vacuum is generated in the vacuum line 142 when the switch 400 is pulled to the outside, vacuum adsorption force is resultantly generated in the vacuum hole 123, vacuum groove 111 and vacuum gauge 300 of the main body 100 simultaneously.

Figure 3:
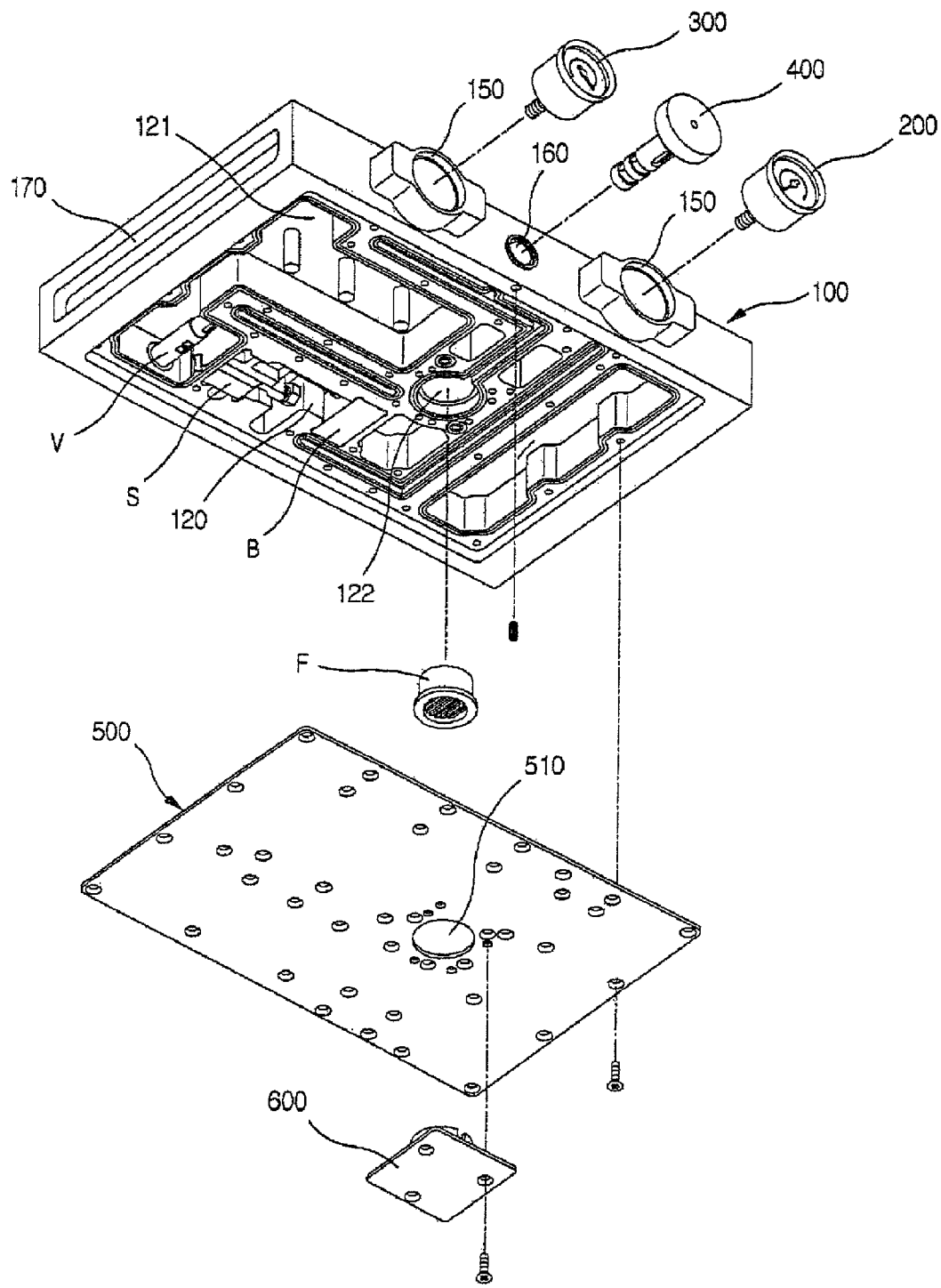
FIG. 3 is an exploded schematic view of the invention.
Figure 15:
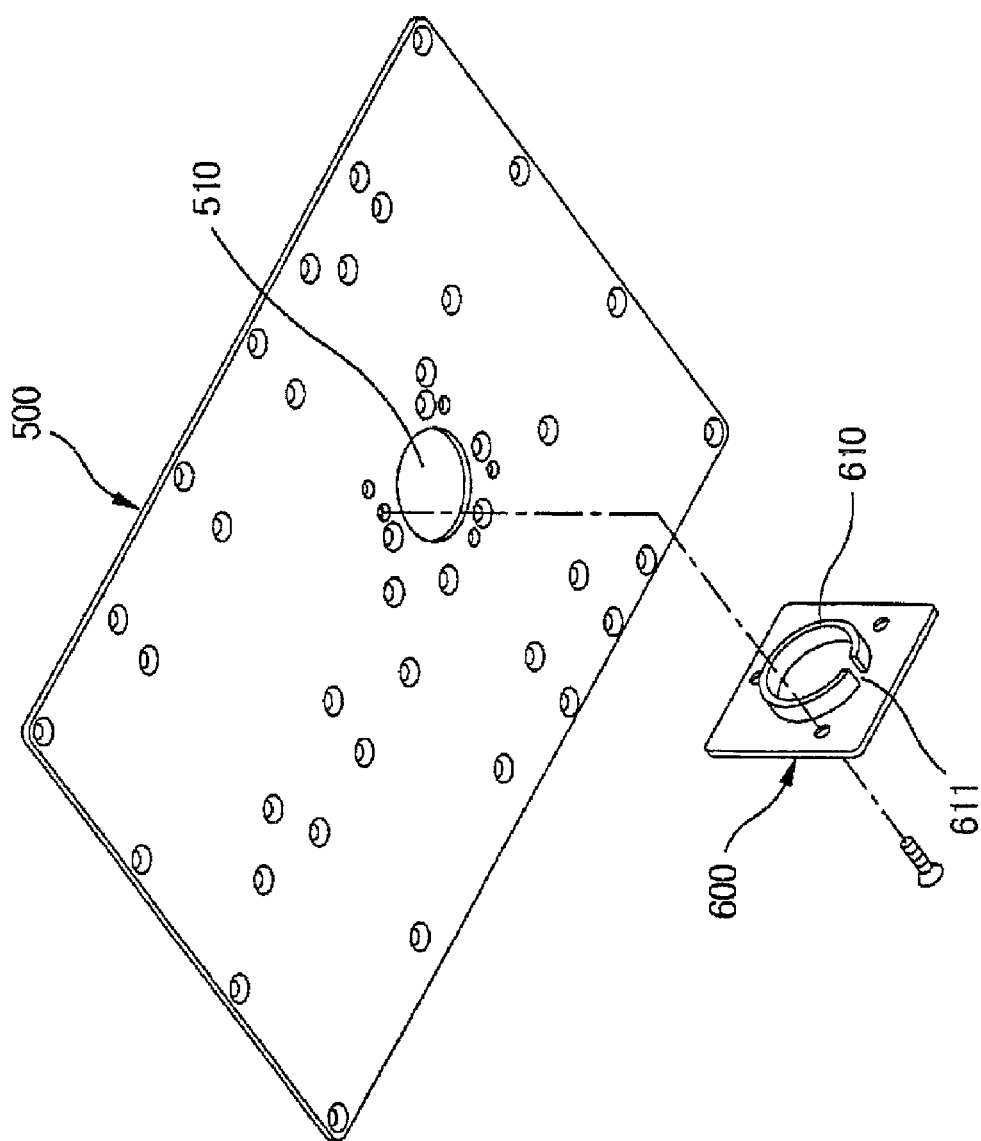
FIG. 15 is an exploded schematic view of a cover and a filter cover according to the invention.

The main body cover 500 is rigidly and air-tightly assembled on the bottom of the main body 100 through a plurality of screw couplings as shown in FIGS. 3 and 15, and has a filter insertion hole 510 therein to substitute filter F with ease.

The filter cover 600 is rigidly assembled to the main body cover 500 through a plurality of screw couplings in the state that it is arranged on the bottom of the filter space 122 as shown in FIGS. 3 and 15, an insertion tube 610 inserted into the filter insertion hole 510 is included on the top of the filter cover 600 and an incision part 611 is formed in one side of the insertion tube 610 to communicate with the vacuum line 142.

A general operation relation of the invention constructed as described above is described in detail as follows.

First, when compressed air is provided to the inlet 130 in the state in which the artifact to be processed is mounted on the main body 100, some of the compressed air is transferred to the air inflow part of the air saving valve B, some of the compressed air flows into the first pressure line 140 through the through hole 140a, and the compressed air flowing into the first pressure line 140 is transferred to the pressure gauge 200 through the through hole 140b.

The compressed air transferred to the air saving valve B is flown into the second pressure line 141 through the through hole 141a, the compressed air flown into the second pressure line 141 is transferred to the vacuum generator V through the through hole 141b. When the compressed air is flown into the vacuum generator V, the vacuum is generated by the vacuum generator V, the vacuum generated by the vacuum generator V is stored in the vacuum space 121 and air passing through the vacuum generator V is discharged outside through the outlet 131.

When the switch is pulled to the outside in this state, since the vacuum space 121 is opened while the first through hole 421 of the switch 400 and the through hole 142a of the vacuum line 142 pass through each other and the vacuum space 121 and the vacuum line 142 communicate each other through the first connection hole 422 connected to the first through hole 421, the vacuum line 142 resultantly maintains the vacuum state.

Since vacuum is generated in the vacuum line 142 when the switch is pulled to the outside, vacuum adsorption force is generated in the vacuum hole 123, the vacuum groove 111 and the vacuum gauge 300 of the main body 100. Accordingly, since the artifact to be processed is resultantly vacuum-adsorbed and stably clamped to the main body 100, it may be possible to process the artifact to be processed in this state.

After completing the process of the artifact to be processed, when pushing the switch 400 to the inside, the vacuum space 121 is closed by the switch 400 and accordingly the vacuum space 121 and the vacuum line 142 maintain a state that they do not communicate each other. Further, in this state, since the second through hole 431 of the switch 400 and the through hole 142a of the vacuum line 142 communicate each other and outside air is flown into the vacuum line 142 through the second connection hole 432 connected to the second through hole 431, the vacuum line 142 resultantly maintains a state that vacuum is released. Accordingly, since the clamping of the artifact to be processed is released, it is easy to detach the processed artifact to be processed.

As such, when the switch 400 is pushed to the inside, since the vacuum of the vacuum line 142 is released, the vacuum adsorption force is not generated in the vacuum hole 123, the vacuum groove 111 and the vacuum gauge 300 of the main body 100.

Accordingly, the invention has advantages that cost and weight are reduced since the structure of the vacuum chuck is simple and installation space, vacuum space and filter space 120, 121 and 122 are formed therein, parts can be substituted with ease when fixing it in its structure and it is possible to shorten clamping time of the artifact to be processed in its structure since vacuum is stored in the vacuum space 121.

Further, the invention has advantages that it is possible to identify pressure state of the vacuum chuck in the outside with ease through the pressure gauge 200 since the pressure gauge 200 is installed, it is possible to enhance assembling and vacuum efficiency since the vacuum gauge 300 is assembled directly without using hose and nipple and cost can be reduced since the gauge cover 150 is integrally formed.

The invention claimed is:
1. A vacuum chuck comprising:
   a main body including a support projection, a vacuum groove, an installation space, a vacuum space, a filter space, a vacuum hole, an inlet, and an outlet;
   an air saving valve installed in the installation space;
   a vacuum sensor installed in the vacuum space;
   a vacuum generator installed in the filter space;

a pressure gauge communicating with the inlet that is mounted on the front side of the main body, said pressure gauge indicating a pressure state of compressed air flow into the vacuum chuck;

a vacuum gauge communicating with the vacuum space that is mounted on the front side of the main body, said vacuum gauge indicating a vacuum state in the vacuum space;

a switch that is installed in the front-middle of the main body to move to and fro so as to open and close the vacuum space;

a main body cover that is air-tightly coupled to the lower part of the main body; and a filter cover that is coupled to the lower part of the filter space, wherein the support projection and the vacuum groove are arranged in a lattice form on the top surface of the main body, the vacuum hole is formed on the filter space and communicates with the vacuum groove, the inlet communicates with the installation space on the rear side of the main body, and the outlet communicates with the vacuum space on the rear side of the main body.

2. The vacuum chuck according to claim 1, wherein a first pressure line communicating with the inlet and the pressure gauge is formed in the main body, a second pressure line communicating with the air saving valve B and a vacuum generator V is formed in the main body, a vacuum line communicating with the vacuum space, the filter space and the vacuum gauge is formed in the main body, a gauge cover receiving the pressure gauge is formed on the front side of the main body, another gauge cover receiving the vacuum gauge is formed on the front side of the main body, and a switch groove receiving receives the switch on the front-middle of the main body.

3. The vacuum chuck according to claim 2, wherein an internal thread into which a bolt is screwed is formed at the front side of the main body where the pressure gauge is attached, another internal thread into which a bolt is screwed is formed at the front side of the main body where the vacuum gauge is attached a wrenching groove is formed at the front portion of the internal thread, said wrenching groove being wide enough for a nut to be rotated, and another wrenching groove is formed at the front portion of another internal thread, said wrenching groove being wide enough for a nut to be rotated.

4. The vacuum chuck according to claim 2, wherein a key is located in a switch groove, a key groove and a control groove, onto which contacts of the key are provided on one outer surface of the switch, a first groove and a second groove are provided on the rear outer surface of the switch, a first through hole communicating with the vacuum line is provided in the first groove, a second through hole communicating with the vacuum line is provided in the second groove, a first connection hole connected to the vacuum space passes through the middle of the first through hole, and a second connection hole open to external air passes through the middle of the second through hole.

5. The vacuum chuck according to claim 1, wherein an internal thread for setting a reference point is formed in the support projection.

6. The vacuum chuck according to claim 1, wherein a threshold used to prevent foreign substances from flowing in is formed on the upper-outside of the vacuum hole.

7. The vacuum chuck according to claim 1, wherein a filter insertion hole is formed in the main body cover, an insertion tube is inserted into the filter insertion hole, said insertion tube being provided on the filter cover and an incision part is formed at one side of the insertion tube so as to be passed through the vacuum line.

8. The vacuum chuck according to claim 1, wherein the inlet is connected to a compressor that feeds compressed air into the first pressure line through the inlet.

9. A vacuum chuck comprising:

a main body including a support projection, a vacuum groove, an installation space, a vacuum space, a filter space, a vacuum hole, an inlet, and an outlet;

an air saving valve installed in the installation space;

a vacuum sensor installed in the vacuum space;

a vacuum generator installed in filter space;

a pressure gauge communicating with the inlet that is mounted on the front side of the main body, said pressure gauge indicating a pressure state of compressed air flow into the vacuum chuck;

a vacuum gauge communicating with the vacuum space that is mounted on the front side of the main body, said vacuum gauge indicating a vacuum state in the vacuum space;

a switch that is installed in the front-middle of the main body to move to and fro so as to open and close the vacuum space;

a main body cover that is air-tightly coupled to the lower part of the main body; and a filter cover that is coupled to the lower part of the filter space, wherein the support projection and the vacuum groove are arranged in a lattice form on the top surface of the main body, the vacuum hole is formed on the filter space and communicates with the vacuum groove, the inlet communicates with the installation space on the rear side of the main body, and the outlet communicates with the vacuum space on the rear side of the main body, a key is located in a switch groove, a key groove and a control groove, onto which contacts of the key are provided on one outer surface of the switch, a first groove and a second groove are provided on the rear outer surface of the switch, a first through hole communicating with the vacuum line is provided in the first groove, a second through hole communicating with the vacuum line is provided in the second groove, a first connection hole connected to the vacuum space passes through the middle of the first through hole, and a second connection hole open to external air passes through the middle of the second through hole.

* * * * *